(12) United States Patent
Ju et al.

(10) Patent No.: US 11,296,655 B2
(45) Date of Patent: Apr. 5, 2022

(54) POWER AMPLIFIER BIASING NETWORK PROVIDING GAIN EXPANSION

(71) Applicant: Renesas Electronics America Inc., San Jose, CA (US)

(72) Inventors: Hojung Ju, San Diego, CA (US); Roberto Aparicio Joo, San Diego, CA (US); John Zhao, San Diego, CA (US); Jason May, San Diego, CA (US)

(73) Assignee: Renesas Electronics America Inc., San Jose, CA (US)

( * ) Notice: Subject to any disclaimer, the term of this patent is extended or adjusted under 35 U.S.C. 154(b) by 123 days.

(21) Appl. No.: 16/860,533

(22) Filed: Apr. 28, 2020

(65) Prior Publication Data

US 2020/0358401 A1 Nov. 12, 2020

Related U.S. Application Data

(60) Provisional application No. 62/846,619, filed on May 11, 2019.

(51) Int. Cl.
| | | |
|---|---|---|
| *H03F 3/04* | (2006.01) | |
| *H03F 1/02* | (2006.01) | |
| *H03F 3/213* | (2006.01) | |
| *H03F 1/30* | (2006.01) | |
| *H03F 1/32* | (2006.01) | |
| *H03G 3/30* | (2006.01) | |

(52) U.S. Cl.
CPC ........... *H03F 1/0211* (2013.01); *H03F 1/301* (2013.01); *H03F 1/3205* (2013.01); *H03F 3/213* (2013.01); *H03G 3/3042* (2013.01); *H03F 2200/18* (2013.01); *H03F 2200/21* (2013.01); *H03F 2200/294* (2013.01); *H03F 2200/451* (2013.01); *H03G 2201/103* (2013.01); *H03G 2201/307* (2013.01)

(58) Field of Classification Search
CPC ..... H03F 1/30; H03F 1/32; H03F 3/04; H03F 2200/18; H03G 2201/40
USPC .................................... 330/285, 289; 333/14
See application file for complete search history.

(56) References Cited

U.S. PATENT DOCUMENTS 8,228,122 B1 * 7/2012 Yuen .......................... G05F 1/56
330/289

* cited by examiner

*Primary Examiner* — Steven J Mottola
(74) *Attorney, Agent, or Firm* — Scully, Scott, Murphy & Presser, P.C.

(57) ABSTRACT

An apparatus includes an amplifier and a bias network. The amplifier generally has a predefined linear range. The bias network is generally connected to an input of the amplifier. The bias network generally comprises a linearizer configured to provide gain expansion and extend linearity of the amplifier beyond the predefined linear range.

19 Claims, 11 Drawing Sheets

POWER AMPLIFIER BIASING NETWORK PROVIDING GAIN EXPANSION

This application relates to U.S. Provisional Application No. 62/846,619, filed May 11, 2019, which is hereby incorporated by reference in its entirety.

FIELD OF THE INVENTION

The invention relates to radio frequency amplifiers generally and, more particularly, to a method and/or apparatus for implementing a power amplifier biasing network providing gain expansion.

BACKGROUND

An amplifier is an electronic circuit used to increase a level or power of an input signal. A linear amplifier produces an output signal that is proportional to the input signal, but capable of delivering more power into a load. Linear amplifiers are typically used in radio frequency (RF) communications applications. In a communications system, amplifier linearity is important to minimize distortion in the output signal. Conventional amplifiers have a limited range of input levels where the output level is linearly related to the input level. When an upper level of the linear range is exceeded, the amplifiers begin to compress the output signal, resulting in distortion. Therefore, power amplifiers with high linearity are desired in transmitter systems.

A reference bias current is used to bias a power amplifier. The reference bias current is used to generate a reference voltage that is applied to bias transistors of a core of the power amplifier. Both to obtain high output and avoid distortions due to low linearity, maintaining the bias of the amplifier as designed up to an input power as large as possible is important.

It would be desirable to implement a power amplifier biasing network providing gain expansion.

SUMMARY

The invention concerns an apparatus including an amplifier and a bias network. The amplifier generally has a predefined linear range. The bias network is generally connected to an input of the amplifier. The bias network generally comprises a linearizer configured to provide gain expansion and extend linearity of the amplifier beyond the predefined range.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a power amplifier biasing network providing gain expansion that may (i) be implemented using gallium arsenide (GaAs) pseudomorphic high electron mobility transistor (pHEMT) technology, (ii) provide a linearized power amplifier, (iii) implement a linearizer comprising an enhancement mode pHEMT and a stacked metal-insulator-metal (MIM) capacitor for gain expansion, (iv) reduce a current mirror mismatch by reducing leakage current, (v) provide high temperature current compensation, (vi) provide sensing gain adjustment, and/or (vii) be implemented as one or more monolithic microwave integrated circuits (MMICs).

Figure 1:
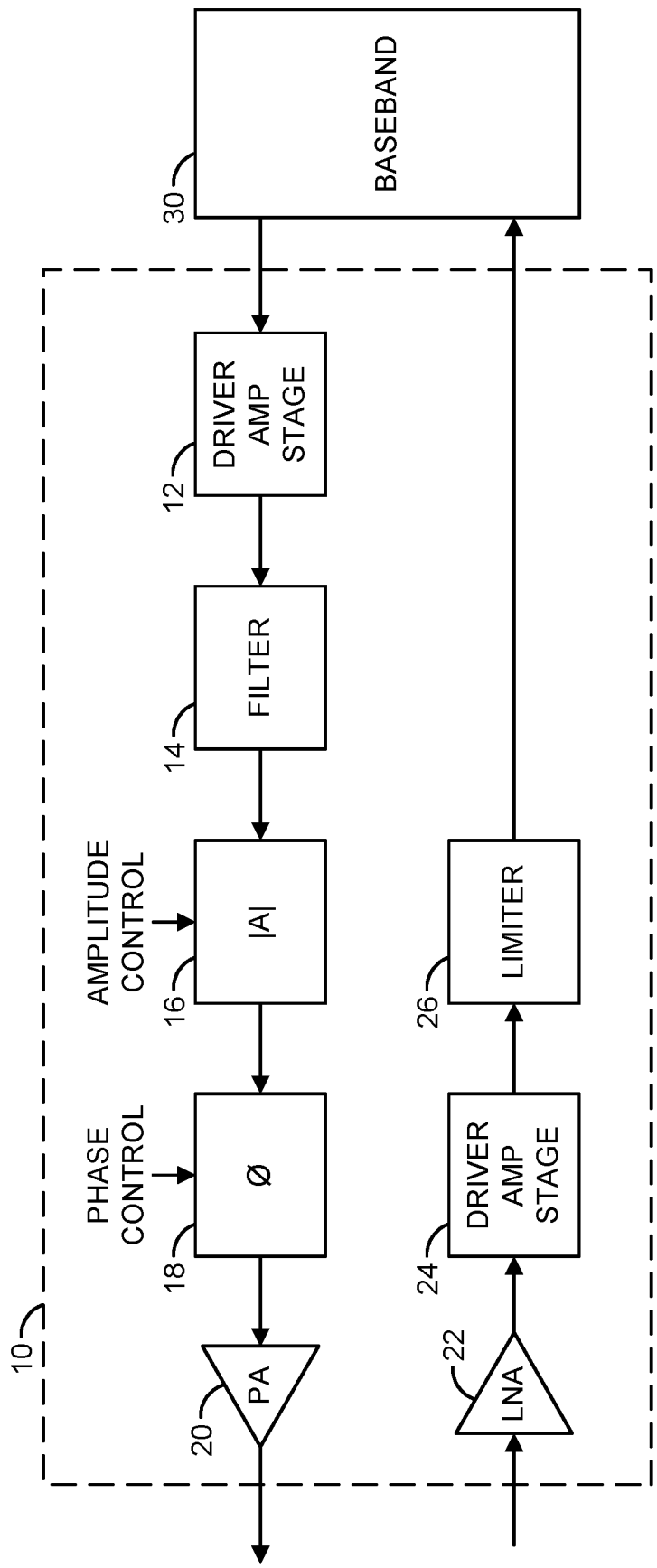
FIG. 1 is a diagram illustrating an example radio frequency (RF) amplifier application.

Referring to FIG. 1, a block diagram of a transceiver circuit 10 is shown illustrating a typical radio frequency (RF) amplifier application. In an example, the transceiver circuit 10 generally comprises both a transmitter chain and a receiver chain. Both the transmitter chain and the receiver chain may comprise radio frequency (RF) amplifiers. In an example, the transmitter chain may include, but is not limited to, one or more input amplifier stages 12, a filter 14, a variable attenuator 16, a variable phase shifter 18, and one or more output amplifier stages 20. In an example, the input amplifier stages 12 may be include low noise amplifier (LNA) and/or driver amplifier stages. The output amplifier stages 20 may include driver amplifiers, pre-amplifiers, and/or power amplifiers. In an example, the receiver chain may include, but is not limited to, a low noise amplifier (LNA) 22, a driver amplifier stage 24, and a limiter (or protection) circuit 26. In an example, an input of the transmitter chain and an output of the receiver chain may be coupled to a baseband circuitry 30 of a telecommunications system. In various embodiments, a biasing network in accordance with an example embodiment of the invention may be implemented in connection with any or all of the amplifiers in the transceiver circuit 10.

Figure 2:
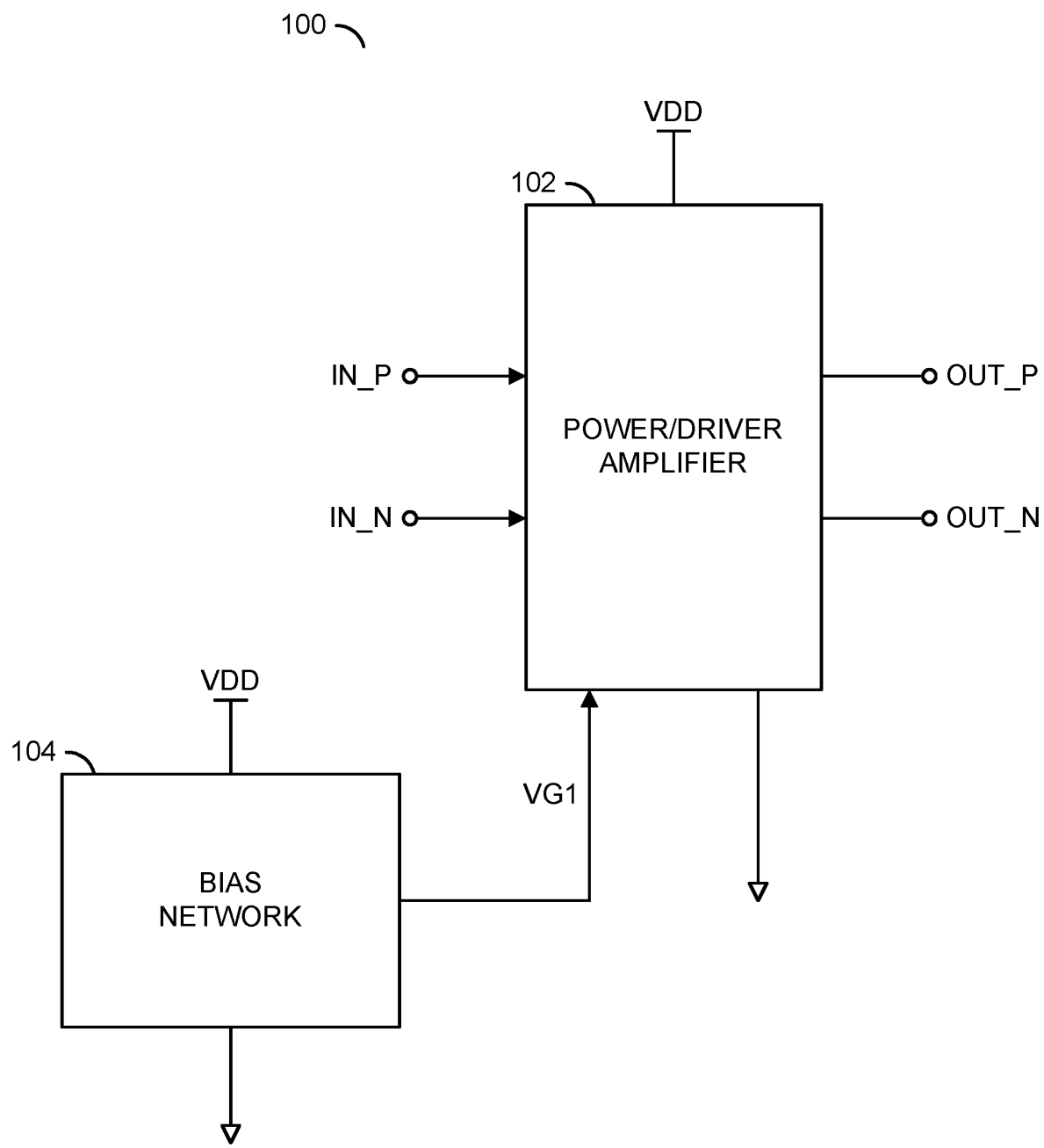
FIG. 2 is a block diagram illustrating an example power amplifier circuit in accordance with an example embodiment of the invention.

Referring to FIG. 2, a block diagram of a circuit 100 is shown illustrating an amplifier implementing a biasing network in accordance with an example embodiment of the invention. In various embodiments, the circuit 100 may be used to implement various amplifiers in millimeter-wave, microwave, and/or beam former chipsets. In an example, the circuit 100 may be used to implement one or more stages of the driver amplifier stages 12, the power amplifier 20, the low noise amplifier 22, and/or the driver amplifier stages 24. In an example, the circuit 100 may be implemented as a monolithic microwave integrated circuit (MMIC) power amplifier.

In an example, the circuit 100 may comprise a power amplifier (PA) core (or circuit) 102 and a bias network (or circuit) 104. However, other types of amplifier cores (e.g., LNA, etc.) may be implemented accordingly to meet the design criteria of a particular application. In various embodiments, the bias network 104 utilizes linearization techniques in accordance with example embodiments of the invention to provide gain expansion and improve linearity for wideband modulated signals used in millimeter-wave, microwave, and/or beam former power amplifiers.

In an example, the amplifier circuit 102 may have a differential input, a differential output, and a bias input. The differential input may comprise a positive (true) input (+) and a negative (complementary) input (−). The differential output may comprise a positive (true) output and a negative (complementary) output. In an example, a signal (e.g., IN_P) may be presented to the positive input, a signal (e.g., IN_N) may be presented to the negative input, a bias signal (e.g., VG1) may be presented to the bias input, a signal (e.g., OUT_P) may be presented at the positive output, and a signal (e.g., OUT_N) may be presented at the negative output. The signals IN_P and INN may be components of a differential input signal. The signals OUT_P and OUT_N may be components of a differential output signal. The signal VG1 may be a bias reference voltage. The bias input at which the signal VG1 is applied may be referred to as a biasing node of the amplifier circuit 102. The biasing node is generally an internal circuit node, which is generally not measurable. However, the impedance level of the biasing node may be checked through simulation. The amplifier circuit 102 may be configured to generate the signals OUT_P and OUT_N in response to the signals IN_P, IN_N, and VG1.

In an example, the circuit 104 may be configured to generate the bias reference voltage VG1 in response to a supply voltage (e.g., VDD). In various embodiments, the bias network (or circuit) 104 implemented in accordance with embodiments of the invention may utilize a linearizer implemented in gallium arsenide (GaAs) pseudomorphic high electron mobility transistor (pHEMT) technology. The linearizer generally acts to expand a gain range and improve linearity of the amplifier circuit 102.

Figure 3:
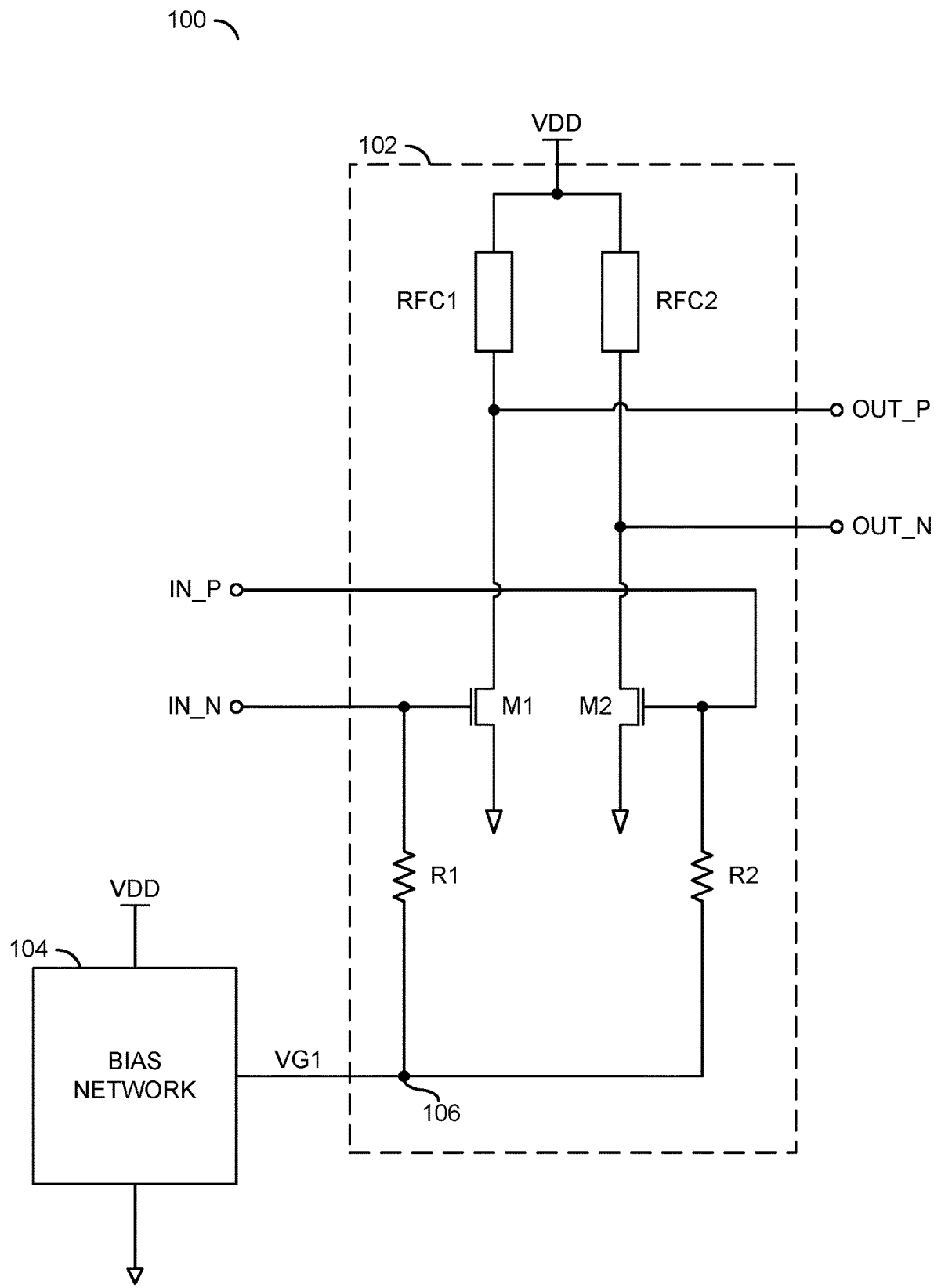
FIG. 3 is a diagram illustrating an example power amplifier circuit in accordance with an example embodiment of the invention.

Referring to FIG. 3, a diagram of the circuit 100 is shown illustrating an example implementation of a differential amplifier implementing a bias network in accordance with an example embodiment of the invention. In an example, the circuit 102 may implement a differential power amplifier (PA). In an example, the PA 102 may be implemented having one or more amplifier stages. The biasing technique illustrated in FIG. 3 may be used with any PA topology, including, but not limited to, single-ended, differential, common-source, cascade, and stacked amplifiers.

In an example, the amplifier 102 may have a differential input, a differential output, and a bias input. The differential input may comprise a positive (true) input and a negative (complementary) input. The differential output may comprise a positive (true) output and a negative (complementary) output. In an example, the signal IN_P may be presented to the positive input, the signal IN_N may be presented to the negative input, the signal VG1 may be presented to the bias input, the signal OUT_P may be presented at the positive output, and the signal OUT_N may be presented at the negative output. The signals IN_P and IN_N may be components of a differential input signal. The signals OUT_P and OUT_N may be components of a differential output signal.

In an example, the amplifier 102 may comprise a transistor M1, a transistor M2, a radio frequency choke RFC 1, and a radio frequency choke RFC 2. In an example, the transistors M1 and M2 may be implemented as metal oxide semiconductor field effect transistors (MOSFETs). The negative input of the amplifier 102 may be connected to a gate terminal of the transistor M1. The positive input of the amplifier 102 may be connected to a gate terminal of the transistor M2. A source terminal of the transistor M1 and a source terminal of the transistor M2 may be connected to a circuit ground potential. A drain terminal of the transistor M1 may be connected to a first terminal of the radio frequency choke RFC 1 and the positive output of the amplifier 102. A drain terminal of the transistor M2 may be connected to a first terminal of the radio frequency choke RFC 2 and the negative output of the amplifier 102. A second terminal of the radio frequency choke RFC 1 and a second terminal of the radio frequency choke RFC 2 may be coupled to a supply voltage (e.g., VDD).

In an example, the amplifier 102 may be biased using a couple of resistors. In an example, a resistor R1 may have a first terminal connected to the positive input of the amplifier 102 and a second terminal configured to receive the bias voltage VG1. A resistor R2 may have a first terminal connected to the negative input of the amplifier 102 and a second terminal configured to receive the bias voltage VG1. A node 106 formed by the connection of the second terminals of the resistors R1 and R2 may be referred to as a biasing node of the amplifier 102. The amplifier 102 may be configured to generate the signals OUT_P and OUT_N in response to the signals IN_P, IN_N, and VG1.

In various embodiments, the radio frequency chokes RFC 1 and RFC 2 may be implemented using inductors. In one example, each of the inductors may be implemented with a bondwire at a lead frame-based package. In another example, each of the inductors may be implemented with a conductive metal layer land for a grid array package. In another example, the inductors may be implemented by integrated spiral inductors on-chip or by surface-mount-device (SMD) components in a module.

Figure 4:
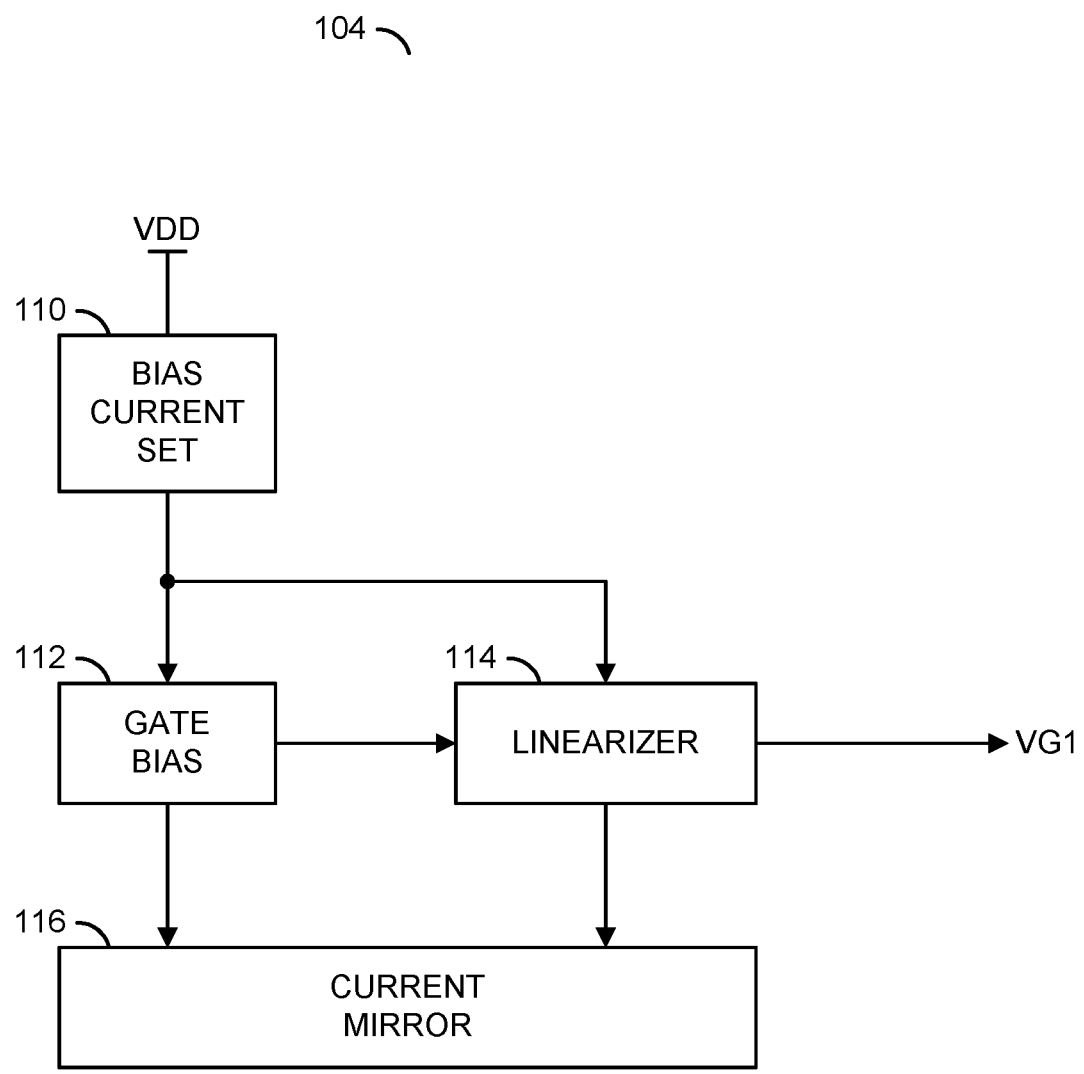
FIG. 4 is a diagram illustrating an example implementation of a bias network in accordance with an example embodiment of the invention.

Referring to FIG. 4, a diagram is shown illustrating an example implementation of a biasing network in accordance with an example embodiment of the invention. In an example, the circuit 104 may comprise a block (or circuit) 110, a block (or circuit) 112, a block (or circuit) 114, and a block (or circuit) 116. The circuit 110 may have an input that may receive a power supply voltage (e.g., VDD). The power supply voltage may be the same as the power supply voltage for the amplifier circuit 102. The circuit 110 may present an output to an input of the circuit 112 and a first input of the circuit 114. The circuit 112 may present a first output to a second input of the circuit 114 and a second output to a first input of the circuit 116. A first output of the circuit 114 may be presented to a second input of the circuit 116. The signal VG1 may be presented at a second output of the circuit 114.

The circuit 110 may implement a bias current setting circuit. The circuit 112 may implement a gate bias circuit. The circuit 114 may implement a linearizer circuit. The circuit 116 may implement a current mirror circuit. The circuit 110 may be configured to generate a reference bias current for the biasing network 104 in response to the power supply voltage VDD. The circuit 112 may generate a gate bias signal for the circuit 114 in response to the reference bias current. The circuit 114 may generate the signal VG1 in response to the gate bias signal and the reference bias current. The circuit 116 generally mirrors a current from the circuit 112 with a current from the circuit 114.

Figure 5:
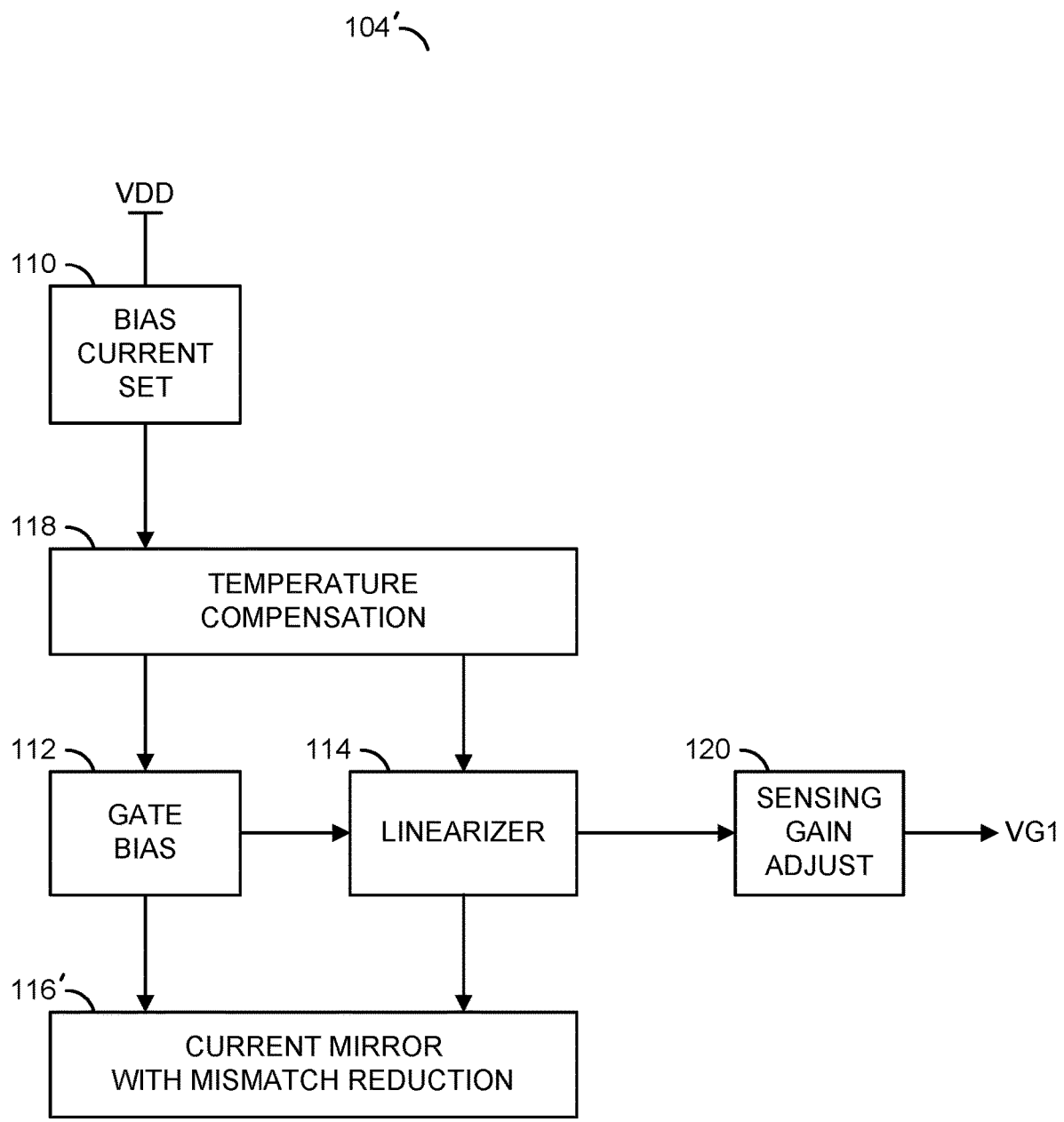
FIG. 5 is a diagram illustrating another example implementation of a bias network in accordance with an example embodiment of the invention.

Referring to FIG. 5, a diagram of a circuit 104' is shown illustrating another example implementation of a biasing network in accordance with an example embodiment of the invention. In an example, the circuit 104' may comprise the circuit 110, the circuit 112, the circuit 114, a block (or circuit) 116', a block (or circuit) 118, and a block (or circuit) 120. The circuit 110 may have an input that may receive a power supply voltage (e.g., VDD). The power supply voltage may be the same as the power supply voltage for the amplifier circuit 102. The circuit 110 may present an output to an input of the circuit 118. The circuit 118 may present a first output to an input of the circuit 112 and a second output to a first input of the circuit 114. The circuit 112 may present a first output to a second input of the circuit 114 and a second output to a first input of the circuit 116'. A first output of the circuit 114 may present a signal to a second input of the circuit 116'. A second output of the circuit 114 may present a signal to an input of the circuit 120. The signal VG1 may be presented at an output of the circuit 120.

The circuit 110 may implement a bias current setting circuit. The circuit 112 may implement a gate bias circuit. The circuit 114 may implement a linearizer circuit. The circuit 116' may implement a current mirror circuit with mismatch reduction. The circuit 118 may implement a temperature compensation circuit. The circuit 120 may implement a sensing gain adjustment circuit. The circuit 110 may be configured to generate a reference bias current for the biasing network 104 in response to the power supply voltage VDD. The circuit 118 may generate temperature compensated reference currents by applying high temperature current compensation on the reference bias current from the circuit 110. The circuit 112 may generate a gate bias signal for the circuit 114 in response to one of the temperature compensated reference currents from the circuit 118. The circuit 114 may generate a bias voltage signal in response to another of the temperature compensated reference currents from the circuit 118 and the gate bias signal from the circuit 112. The circuit 116' generally mirrors a current from the circuit 112 with a current of the circuit 114 while reducing mismatch between the two currents. The circuit 120 generates the signal VG1 in response to the bias voltage provided by the circuit 114.

Figure 6:
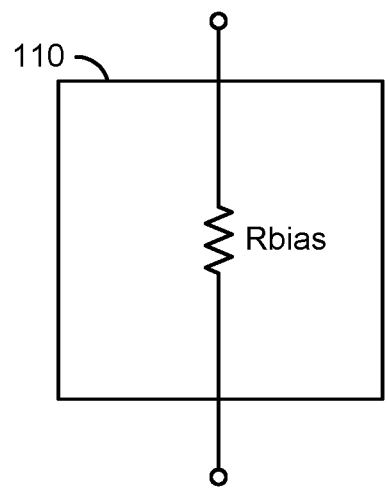
FIG. 6 is a diagram illustrating an example reference bias current setting circuit in accordance with an example embodiment of the invention.

Referring to FIG. 6, a diagram is shown illustrating an example implementation of the reference bias current setting circuit 110 in accordance with an example embodiment of the invention. In an example, an integrated resistor (e.g., Rbias) may be implemented to set the reference bias current in response to the supply voltage VDD. The integrated resistor Rbias generally controls the bias current of the biasing network 104. The bias current generated may be dependent upon the type of resistor used to implement Rbias. In an example, the implemented resistor type may change the bias current with regard to temperature variation. Different temperature coefficient resistor types are generally available. In an example, when a negative coefficient resistor is used as the resistor Rbias, the reference bias current may increase at higher temperatures.

In general, any type of resistor may be used to implement the resistor Rbias. When a negative or lower temperature coefficient resistor is used, temperature compensation may be improved further. In an example, a resistor implemented in complementary metal oxide semiconductor (CMOS), semiconductor-on-insulator (SOI) and/or silicon germanium (SiGe) technologies exhibits the negative temperature coefficient resistance. For gallium arsenide (GaAs) pseudomorphic high electron mobility transistor (pHEMT) technology, a thin film resistor (TFR) may be used for the purpose of the lower temperature coefficient. In Silicon technologies, a Poly or NWELL type resistor shows the negative coefficient for temperature.

Figure 7:
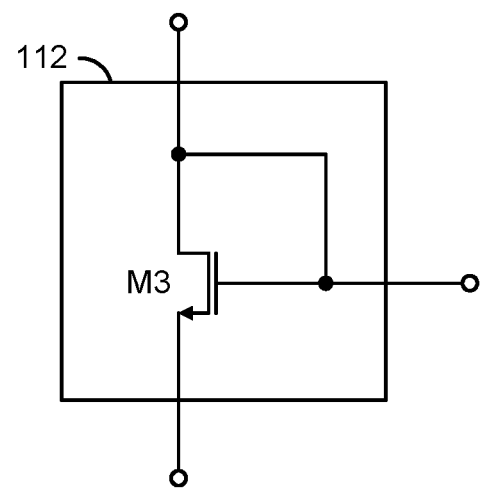
FIG. 7 is a diagram illustrating an example gate bias setting circuit in accordance with an example embodiment of the invention.

Referring to FIG. 7, a diagram is shown illustrating an example implementation of the gate bias setting circuit 112 in accordance with an example embodiment of the invention. In an example, the gate bias setting circuit 112 may be implemented as a transistor M3 configured as a common gate bias setting circuit. In an example, the transistor M3 may be implemented using pseudomorphic high electron mobility transistor (pHEMT) technology. In an example, a drain terminal and a gate terminal of the transistor M3 may be tied together. The drain terminal of the transistor M3 may be connected to either the circuit 110 or the circuit 118. A source terminal of the transistor M3 may be connected to the first input of either the circuit 116 or 116'. The gate terminal of the transistor M3 may be connected to the second input of the circuit 114.

Figure 8:
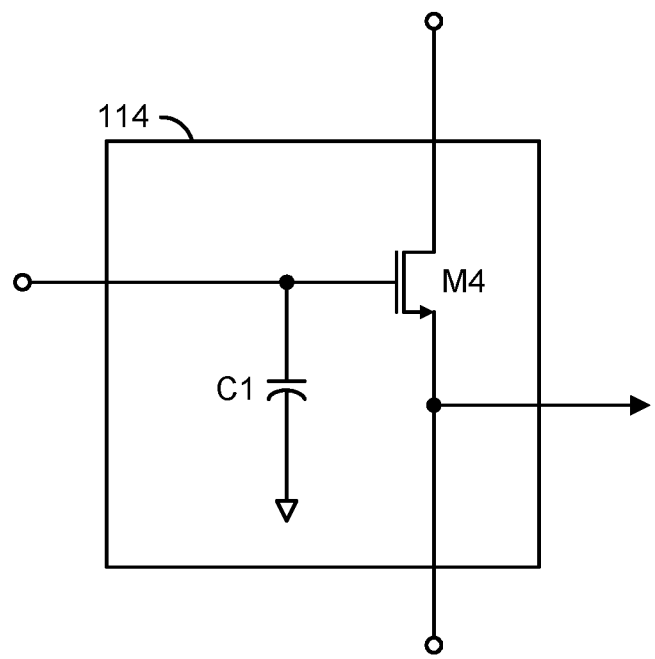
FIG. 8 is a diagram illustrating an example linearizer circuit in accordance with an example embodiment of the invention.

Referring to FIG. 8, a diagram is shown illustrating an example implementation of the linearizer circuit 114 in accordance with an example embodiment of the invention. In an example, the circuit 114 may comprise a transistor M4 and a capacitor C1. In an example, the transistor M4 may be implemented as an enhancement mode (E-mode) pHEMT device. In an example, the capacitor C1 may be implemented as a stacked metal-insulator-metal (MIM) capacitor. The circuit 114 may be utilized to provide gain expansion (e.g., P1 dB improvement). In an example, the transistor M4 may operate as a common gate amplifier based upon a current source resulted from the circuit 116 or 116'. As the RF input signal to the amplifier 102 increases, the gate voltage of the transistor M4 increases with the source voltage of the transistor M4 due to common gate amplifier characteristics. The raised gate voltage of the transistor M4 increases DC gate bias voltage by charging the capacitor C1. This operation is similar to a peak detector. The elevated gate bias voltage increases the DC voltage of the source of the transistor M4. The increase of the DC voltage of the source of the transistor M4 increases the input bias voltage VG1, and the amplifier gain expands according to the increased bias voltage.

Figure 9:
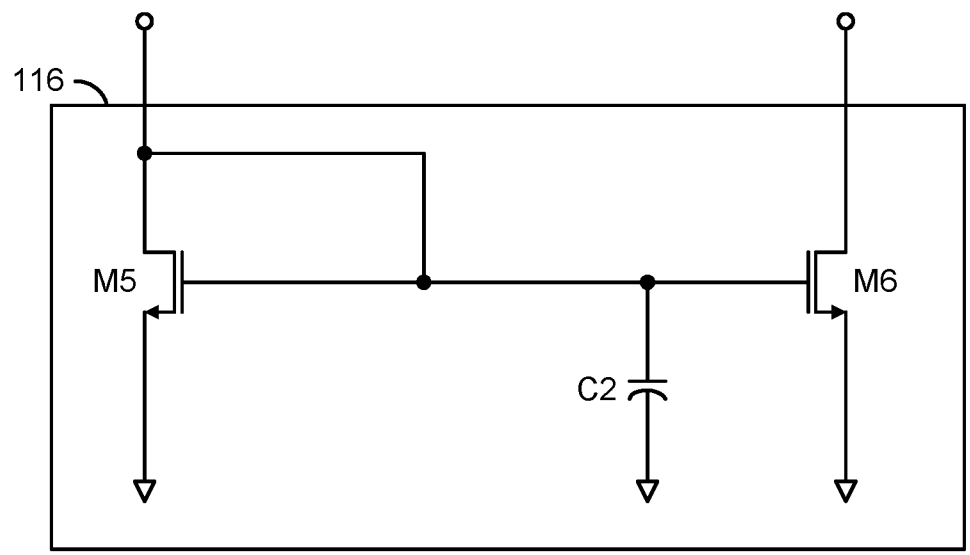
FIG. 9 is a diagram illustrating an example current mirror circuit in accordance with an example embodiment of the invention.

Referring to FIG. 9, a diagram is shown illustrating an example implementation of the current mirror circuit 116 in accordance with an example embodiment of the invention. In an example, the circuit 116 may comprise a transistor M5, a transistor M6, and a capacitor C2. In various embodiments, the transistors M5 and M6 are implemented using the same technology as is used in the rest of the bias network. For example, if the bias network is implemented using pHEMT technology, the transistors M5 and M6 would be implemented in pHEMT technology. A drain terminal of the transistor M5 may be connected to a gate terminal of the transistor M5, a gate terminal of the transistor M6, and a first terminal of the capacitor C2. A source terminal of the transistor M5, a source terminal of the transistor M5, and a second terminal of the capacitor C2 may be connected to the circuit ground potential. The drain terminal of the transistor M5 may receive the current from the circuit 112. The drain terminal of the transistor M6 may receive the current from the circuit 114.

Figure 10:
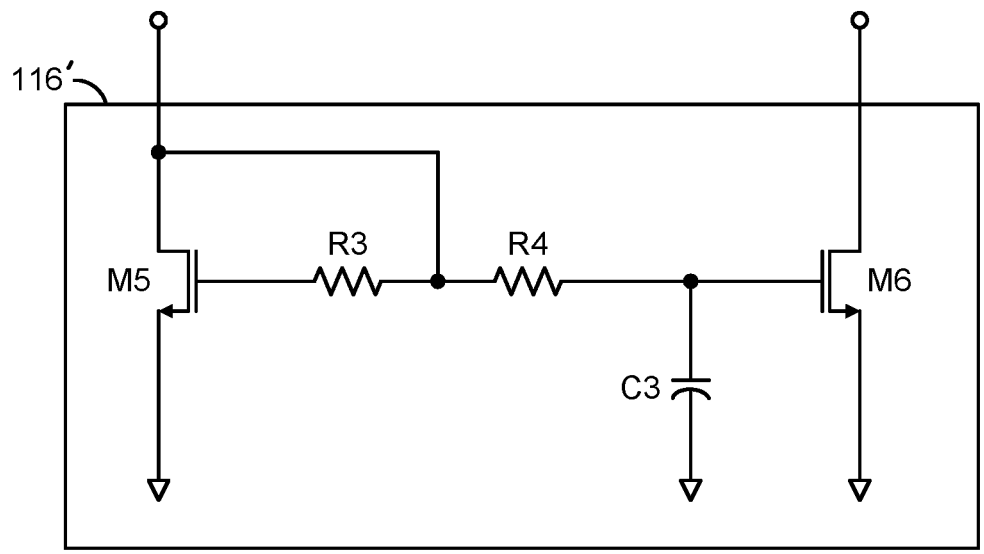
FIG. 10 is a diagram illustrating another example current mirror circuit in accordance with an example embodiment of the invention.

Referring to FIG. 10, a diagram is shown illustrating another example implementation of the current mirror circuit 116' in accordance with an example embodiment of the invention. The circuit 116' may be implemented similarly to the circuit 116, except that a pair of resistors (e.g., R3 and R4) are connected in series and inserted between the gate terminals of the transistors M5 and M6, and the drain terminal of the transistor M5 is connected to a node formed by the connection between the resistors R3 and R4. The inserted resistors R3 and R4 at the gate of the current mirror devices M5 and M6 generally reduce the current mirror mismatch by reducing the leakage gate current.

Figure 11:
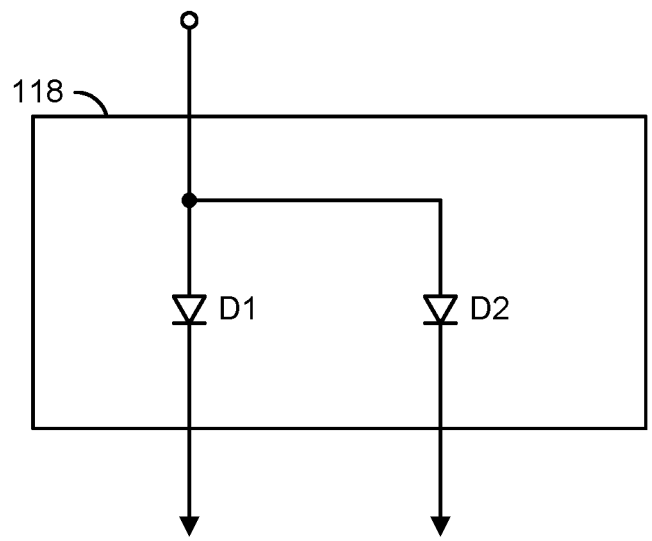
FIG. 11 is a diagram illustrating an example temperature compensation circuit in accordance with an example embodiment of the invention.

Referring to FIG. 11, a diagram of the circuit 118 is shown illustrating an example implementation of the temperature compensation circuit 118 in accordance with an example embodiment of the invention. Typically, the threshold of a pHEMT device decreases according to an increase in temperature. The reduced threshold generally results in decreased DC operation current of a low noise amplifier (LNA) or driver amplifier implemented with the circuit 102. The decreased DC operation current degrades P1 dB performance at higher temperature. In an example, a pair of PN junction diodes (e.g., D1 and D2) may be inserted in the reference bias current paths of the gate bias setting circuit 112 and the linearizer circuit 114. The PN junction diodes D1 and D2 may increase DC operation current according to a decreased turn-on PN junction voltage at higher temperatures. Depending on the particular product application, a maximum high (or hot) temperature may range from approximately 65° C. to about 125° C. In an example, the turn-on PN junction voltage at 25° C. may be 1.35 Volts (V), and may decrease to about 1.25V and 1.18V at 85° C. and 115° C., respectively.

Figure 12:
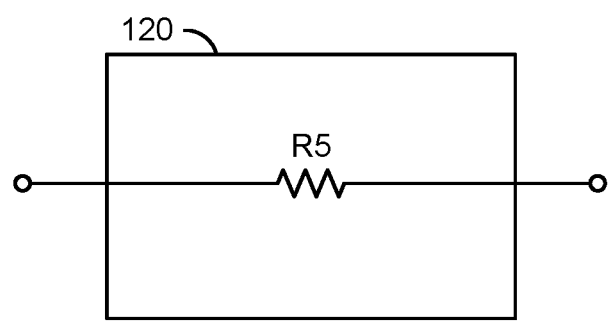
FIG. 12 is a diagram illustrating an example sensing gain adjustment circuit in accordance with an example embodiment of the invention.

Referring to FIG. 12, a diagram is shown illustrating an example implementation of the sensing gain adjustment circuit 120 in accordance with an example embodiment of the invention. In an example, the circuit 120 may be implemented as a resistor R5. The resistor R5 is generally configured for gain adjustment of the common gate amplifier of the circuit 114. In an example, a value of the resistor R5 may adjust a sensing amount of RF input power. Too large of a value may prevent sensing the RF input power. Too small of a value may degrade OIP3 performance. In general, the appropriate resistance value needs to be selected in order to maximize the gain expansion operation. In an example considering a given P1 dB and OIP3 specification, a value of the resistor R5 may be swept from zero Ohm to 1 kOhms in simulation. In an example, an appropriate value for the resistor R5 may be selected by maximizing P1 dB without OIP3 degradation. In an example, a value of 800 Ohms may be to be appropriate for the resistor R5.

Figure 13:
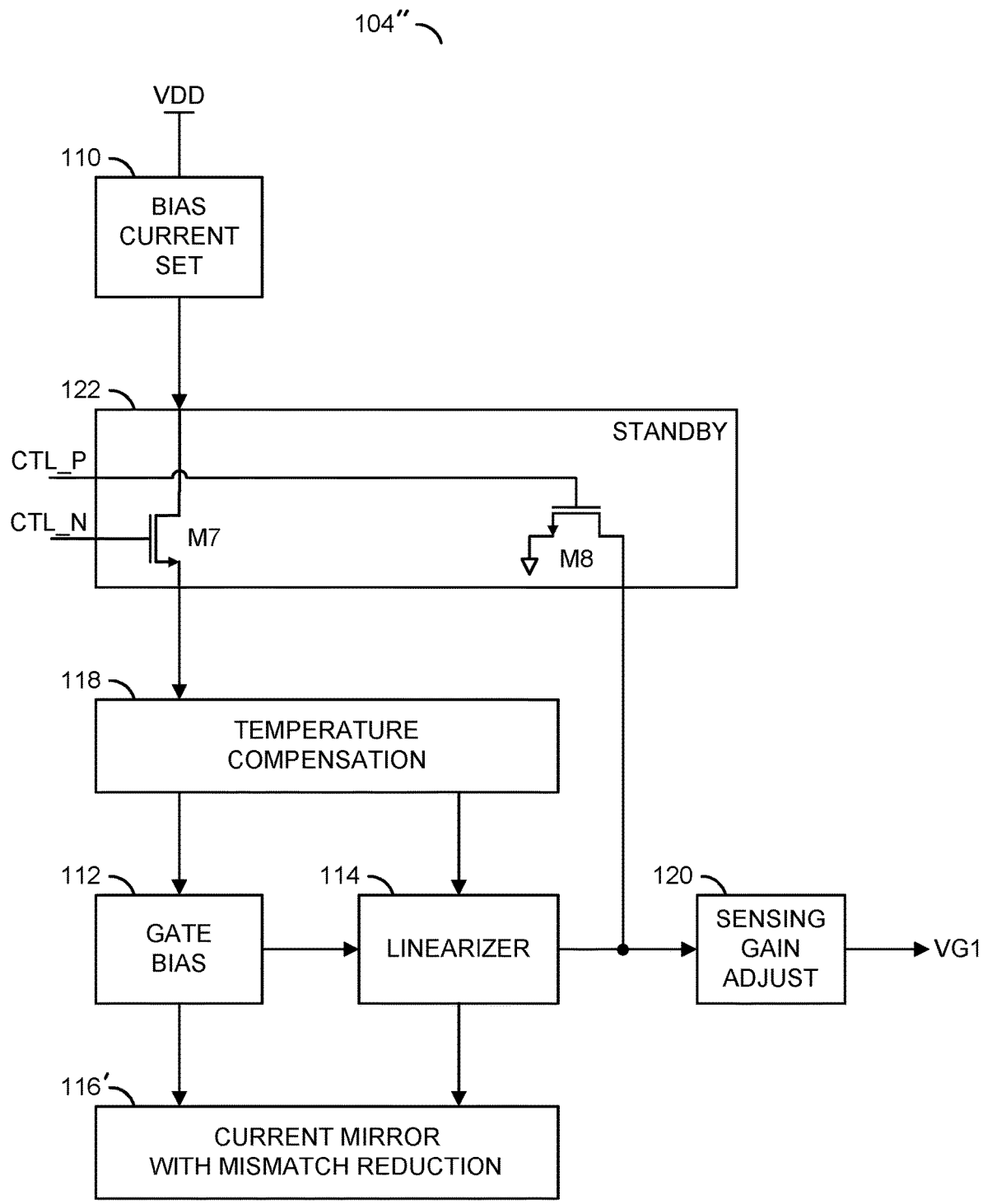
FIG. 13 is a diagram illustrating another example implementation of a bias network in accordance with an example embodiment of the invention.

Referring to FIG. 13, a diagram of a circuit 104" is shown illustrating another example implementation of a biasing network in accordance with an example embodiment of the invention. In an example, the circuit 104" may be implemented similarly to the circuit 104' (or the circuit 104), except that the circuit 104" may include a circuit 122. The circuit 122 may implement a standby control circuit. The circuit 122 may be configured to stop the bias current in a standby mode of the biasing network. In an example, the circuit 122 may comprise a pair of control inputs that may receive a first signal (e.g., CTL_P) and a second signal (e.g., CTL_N). In an example, the signals CTL_P and CTL_N may be components of a differential control signal.

In an example, the output of the circuit 110 may be presented to an input of the circuit 122. The circuit 122 may have a first output that is presented to the input of the circuit 118 (or the input of the circuit 112 in the circuit 104) and a second output that may be connected to the second output of the circuit 114. In an example, the circuit 122 may comprise a transistor M7 and a transistor M8. The transistors M7 and M8 may be configured as switches. In an example, the transistor M7 may be configured to switch the reference bias current from the circuit 110 to the circuit 118 in response to the signal CTL_N. In an example, the transistor M8 may be configured to set (tie) the second output of the circuit 114 to the circuit ground potential in response to the signal CTL_P.

Figure 14:
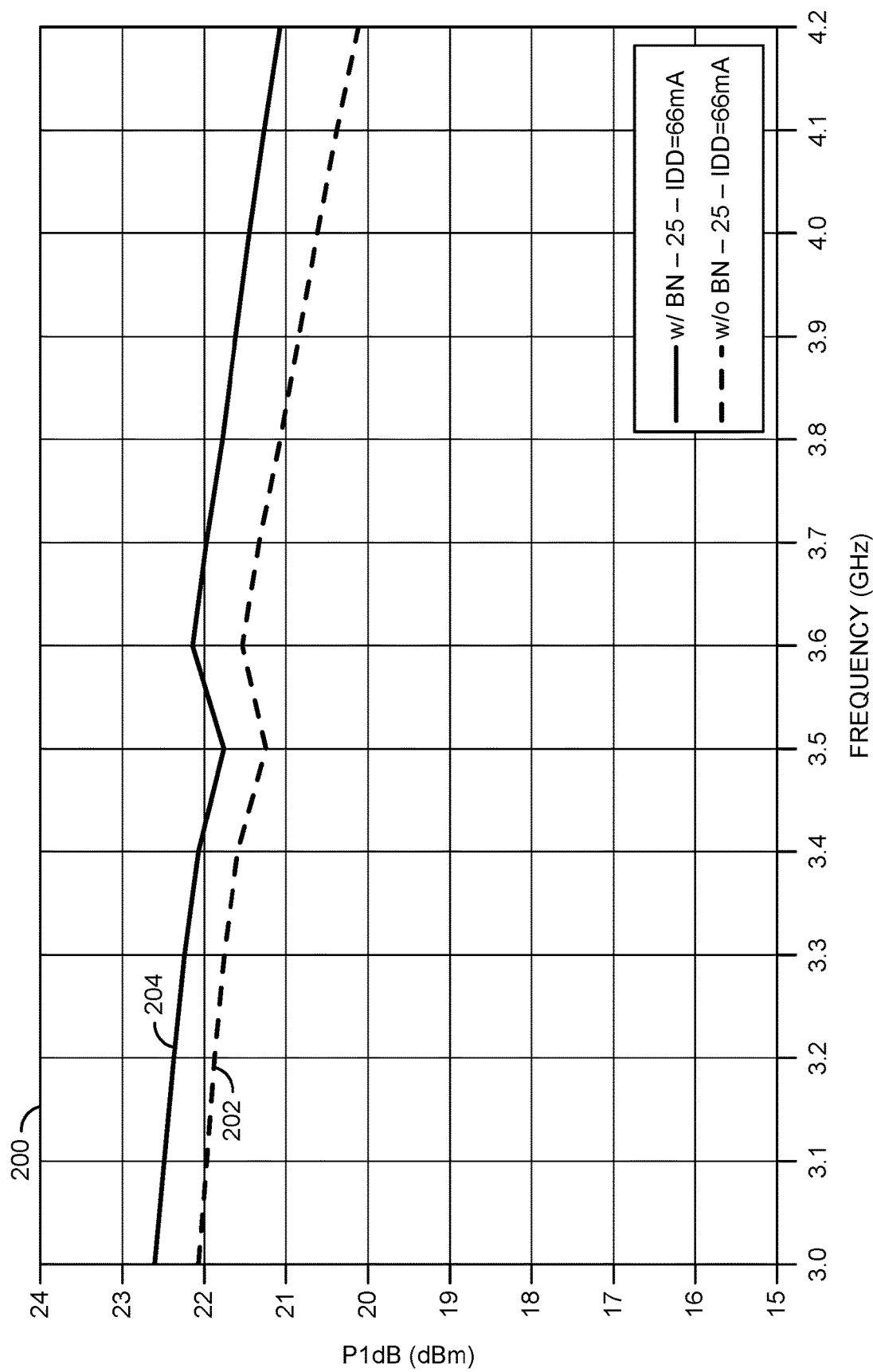
FIG. 14 is a diagram illustrating P1 dB simulation results for a temperature of 25 degrees Celsius (° C.) for an amplifier with and without a bias network in accordance with an example embodiment of the invention.

Referring to FIG. 14, a diagram is shown illustrating P1 dB simulation results for a temperature of 25° C. for an amplifier with and without a biasing network in accordance with an example embodiment of the invention. In an example, a chart 200 illustrates a comparison of 1 dB compression point vs. frequency at 25° C. for an amplifier without a biasing network in accordance with an example embodiment of the invention (curve 202) and an amplifier with a biasing network in accordance with an example embodiment of the invention (curve 204).

Figure 15:
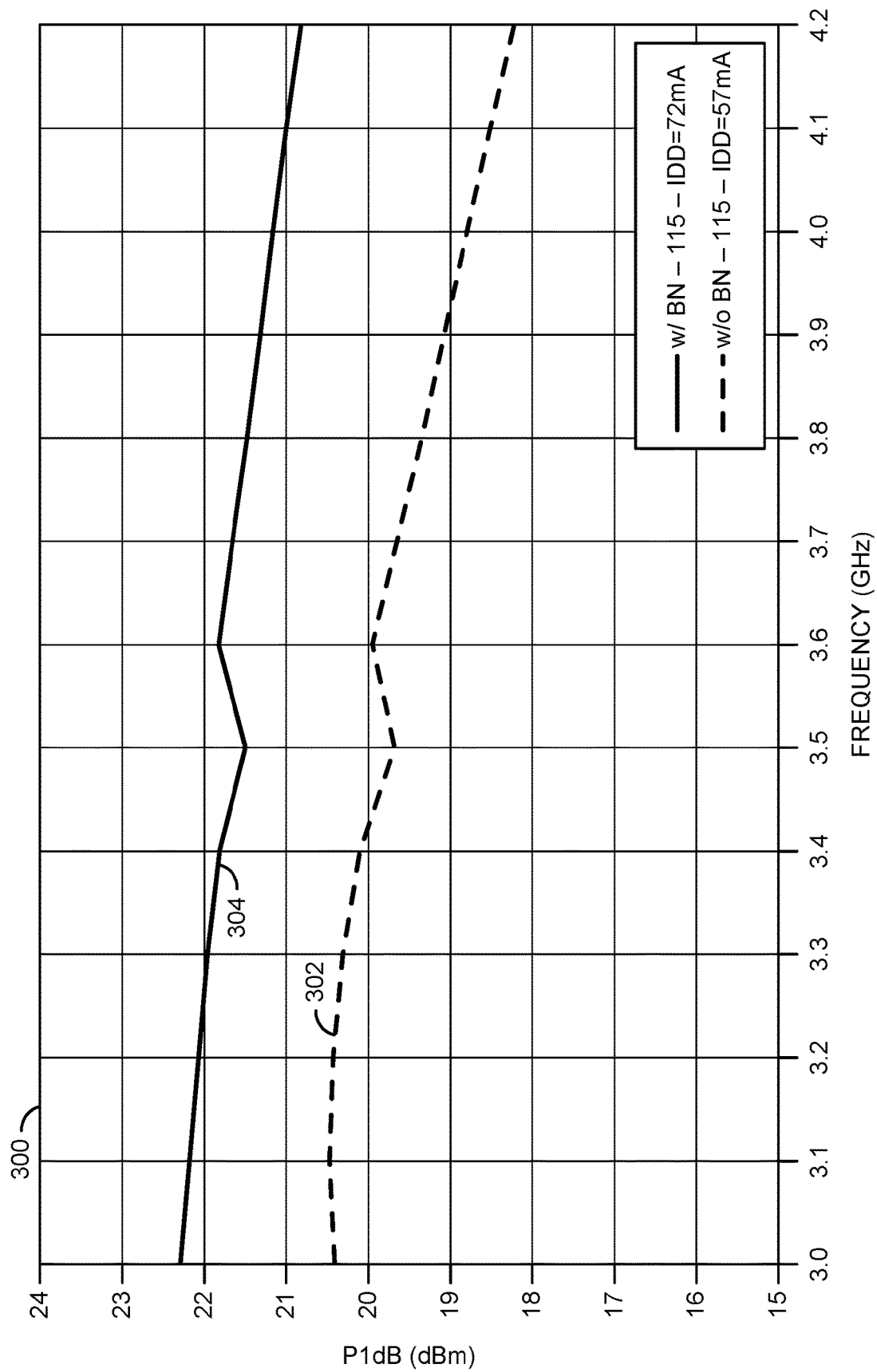
FIG. 15 is a diagram illustrating P1 dB simulation results for a temperature of 115° C. for an amplifier with and without a bias network in accordance with an example embodiment of the invention.

Referring to FIG. 15, a diagram is shown illustrating P1 dB simulation results for a temperature of 115° C. for an amplifier with and without a biasing network in accordance with an example embodiment of the invention. In an example, a chart 300 illustrates a comparison of 1 dB compression point vs. frequency at 115° C. for an amplifier without a biasing network in accordance with an example embodiment of the invention (curve 302) and an amplifier with a biasing network in accordance with an example embodiment of the invention (curve 304).

In an example embodiment, a biasing network in accordance with an example embodiment of the invention may be composed of a resistor (e.g., Rbias) for bias current setting, a pair of PN diodes (e.g., D1 and D2) for hot temperature current compensation, a common gate amplifier (e.g., M4), a pair of transistors (e.g., M5 and M6) configured as a current mirror for the bias setting of the common gate amplifier, a transistor (e.g., M3) configured as a common gate bias setting circuit, a pair of resistors (e.g., R3 and R4) configured for current mirror mismatch reduction, and a sensing gain adjustment resistor (e.g., R5). In an example, the bias voltage VG1 may be generated by Vgs(M5)+Vgs(M4)−Vgs(M8), where Vgs(X) is the gate-source overdrive voltage of the respective transistor. The bias voltage VG1 is generally dependent upon the reference bias current generated by the resistor Rbias in response to the supply voltage VDD. In some embodiments, a standby mode may be implemented by a pair of devices (e.g., transistors M7 and M8), which may be configured to stop the reference bias current and set the bias voltage VG1 to the circuit ground potential. In an example, all the transistors described herein may be implemented using pHEMT technology.

Embodiments of the invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic microwave integrated circuits (MMICs), one or more chips or die arranged as flip-chip modules and/or multi-chip modules, and/or by interconnecting an appropriate network of conventional component circuits, as is described herein, modifications of which will be readily apparent to those skilled in the art(s).

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   an amplifier having a predefined linear range; and
   a bias network connected to an input of said amplifier, wherein said bias network comprises
      a linearizer circuit configured to generate a bias signal based on a reference bias current to provide gain expansion and extend linearity of said amplifier beyond the predefined linear range,
      a gate bias circuit configured to generate a gate bias signal in response to said reference bias current and present said gate bias signal to said linearizer circuit,
      a current mirror circuit configured to mirror a first current from said gate bias circuit with a second current from said linearizer circuit, and
      a bias current temperature compensation circuit configured to (i) receive said reference bias current and (ii) generate a first temperature compensated reference current and a second temperature compensated reference current in response to said reference bias current, wherein said first temperature compensated reference current is presented to an input of said gate bias circuit and said second temperature compensated reference current is presented to an input of said linearizer circuit.

2. The apparatus according to claim 1, wherein said amplifier and said bias network are implemented using gallium arsenide (GaAs) pseudomorphic high electron mobility transistor (pHEMT) technology.

3. The apparatus according to claim 1, wherein said amplifier and said bias network are implemented as one or more monolithic microwave integrated circuits (MMICs).

4. The apparatus according to claim 1, wherein said current mirror circuit is further configured for mismatch reduction.

5. The apparatus according to claim 1, wherein said bias current temperature compensation circuit comprises a plurality of PN junction diodes.

6. The apparatus according to claim 1, wherein said bias network further comprises a standby control circuit configured to turn off the reference bias current of said bias network and tie said bias signal from said linearizer circuit to a circuit ground potential in a standby mode.

7. The apparatus according to claim 1, wherein said linearizer circuit comprises an enhancement mode pseudomorphic high electron mobility transistor configured as a common gate amplifier by a stacked metal-insulator-metal capacitor connected between a gate terminal of said enhancement mode pseudomorphic high electron mobility transistor and a circuit ground potential.

8. The apparatus according to claim 1, wherein said bias network further comprises a bias current setting circuit configured to determine said reference bias current of said bias network.

9. The apparatus according to claim 8, wherein said bias current setting circuit comprises an integrated resistor configured to change said reference bias current in response to temperature variation.

10. The apparatus according to claim 9, wherein said integrated resistor comprises a negative temperature coefficient resistor.

11. The apparatus according to claim 1, wherein said amplifier comprises at least one of a radio frequency amplifier, a low noise amplifier, a driver amplifier, and a power amplifier.

12. The apparatus according to claim 1, wherein said bias network further comprises a sensing gain adjustment circuit connected between an output of said linearizer circuit and said input of said amplifier, and said sensing gain adjustment circuit is configured to adjust a gain of a common gate amplifier of said linearizer circuit.

13. The apparatus according to claim 12, wherein said sensing gain adjustment circuit comprises a resistor providing a sensing gain adjustment of said common gate amplifier of said linearizer circuit.

14. A method of extending amplifier gain linearity comprising:
   coupling a bias network to an input of an amplifier, wherein said amplifier has a predefined linear range, said bias network comprises a linearizer circuit configured to generate an amplifier bias signal based on a reference bias current to provide gain expansion and extend linearity of the amplifier beyond the predefined linear range, and said amplifier and said bias network are implemented with gallium arsenide (GaAs) pseudomorphic high electron mobility transistor (pHEMT) technology;
   generating said reference bias current;
   generating a gate bias signal in response to a first portion of said reference bias current passing through a gate bias circuit;
   generating said amplifier bias signal in response to said gate bias signal and a second portion of said reference bias current passing through said linearizer circuit; and
   mirroring said first portion of said reference bias current passing through said gate bias circuit and said second portion of said reference bias current passing through said linearizer circuit.

15. The method according to claim 14, further comprising:
   compensating said reference bias current for high temperature variation by passing said first portion of said reference bias current through a first PN junction diode and passing said second portion of said reference bias current through a second PN junction diode.

16. The method according to claim 14, wherein said linearizer circuit comprises an enhancement mode pseudomorphic high electron mobility transistor configured as a common gate amplifier and a stacked metal-insulator-metal capacitor connected between a gate terminal of said enhancement mode pseudomorphic high electron mobility transistor and a circuit ground potential.

17. The method according to claim 14, further comprising implementing a standby mode by:
- switching said reference bias current in response to a first control signal; and
- setting said amplifier bias signal to a circuit ground potential in response to a second control signal.

18. An apparatus comprising:
- an amplifier having a predefined linear range; and
- a bias network connected to an input of said amplifier, wherein (i) said bias network comprises a linearizer circuit and a bias current setting circuit, (ii) said linearizer circuit is configured to generate a bias signal based on a reference bias current to provide gain expansion and extend linearity of said amplifier beyond the predefined linear range, (iii) said bias current setting circuit is configured to determine said reference bias current of said bias network, and (iv) said bias current setting circuit comprises an integrated resistor configured to change said reference bias current in response to temperature variation.

19. The apparatus according to claim 18, wherein said integrated resistor comprises a negative temperature coefficient resistor.

* * * * *